United States Patent [19]

Gould

[11] Patent Number: 4,899,199
[45] Date of Patent: Feb. 6, 1990

[54] SCHOTTKY DIODE WITH TITANIUM OR LIKE LAYER CONTACTING THE DIELECTRIC LAYER

[75] Inventor: Herbert J. Gould, Sherman Oaks, Calif.

[73] Assignee: International Rectifier Corporation, Los Angeles, Calif.

[21] Appl. No.: 537,509

[22] Filed: Sep. 30, 1983

[51] Int. Cl.$^4$ ............................................. H01L 29/48
[52] U.S. Cl. ....................................... 387/15; 357/71; 357/55; 357/53
[58] Field of Search .................. 357/15, 4, 50, 49, 42, 357/55, 71 R, 53

[56] References Cited

U.S. PATENT DOCUMENTS

| | | | |
|---|---|---|---|
| 3,512,051 | 5/1970 | Noll | 357/71 X |
| 3,519,900 | 7/1970 | Lawrence | 357/53 X |
| 3,567,508 | 3/1971 | Cox et al. | 357/71 X |
| 3,663,184 | 5/1972 | Wood et al. | 357/71 X |
| 3,761,309 | 9/1973 | Schmihfer et al. | 357/71 X |
| 3,878,554 | 4/1975 | Mikome et al. | 357/71 X |
| 4,065,781 | 12/1977 | Gutknecht | 357/15 |
| 4,201,999 | 5/1980 | Howard et al. | 357/15 |
| 4,206,540 | 6/1980 | Gould | 357/15 |
| 4,408,216 | 10/1983 | Gould | 357/15 |

Primary Examiner—William Mintel
Attorney, Agent, or Firm—Ostrolenk, Faber, Gerb & Soffen

[57] ABSTRACT

A schottky diode with a molybdenum schottky barrier layer has its perimeter encircled by a guard ring. The outer periphery of the guard ring is covered by a passivating oxide layer. The periphery of the molybdenum electrode in one embodiment of the invention has a peripheral edge which extends to but is spaced from the facing periphery of the oxide passivating coating. A layer of titanium metal which adheres to oxide better than does molybdenum, overlies the molybdenum layer and contacts the surface exposed by the gap between the molybdenum and the oxide and overlies and adheres to the oxide layer. Nickel and silver layers are then formed atop the titanium metal layer. Alternatively, the underlying molybdenum layer can extend to and over a portion of the oxide layer. The titanium layer extends over the molybdenum layer and contacts the outer periphery of the oxide to encapsulate the molybdenum and hold it atop the oxide. In both embodiments, a process step is employed in which molybdenum is deposited over the entire surface of the device and the outer periphery of the molybdenum layer is etched back from the outer periphery of the oxide to clear a surface area of the oxide to which an overlying titanium layer can adhere.

14 Claims, 1 Drawing Sheet

SCHOTTKY DIODE WITH TITANIUM OR LIKE LAYER CONTACTING THE DIELECTRIC LAYER

BACKGROUND OF THE INVENTION

This invention relates to Schottky diodes and to a novel process for their manufacture and more specifically relates to a novel process for the manufacture of a Schottky device in which the Schottky forming metal securely adheres to the surface of the device even though it does not adhere well to a peripheral oxide passivation coating.

Schottky diodes are well known which include a molybdenum electrode which forms a Schottky barrier on a silicon substrate. In order to operate such devices at relatively high blocking voltages, it is necessary to use a guard ring of opposite conductivity type to that of the main body, which guard ring is preferably contacted by the molybdenum Schottky forming electrode. It is also desirable to provide a system of solderable metals atop the molybdenum contact. Typically, a titanium or chromium barrier layer is first laid atop the molybdenum layer, followed by a layer of nickel and a layer of silver.

While many different metals can be used to form the schottky barrier, it is necessary to select a metal which strikes a good balance between the desired turn-on voltage of the device in the forward direction and the leakage current in the reverse direction. These are frequently conflicting goals.

Molybdenum is known to provide a good compromise to these contradictory requirements. However, when molybdenum is used in a high voltage device where it is desirable that the metal forming a Schottky contact overlay the guard ring oxide to produce a field plate effect, the molybdenum will not adhere well to the oxide surface. Consequently, devices employing molybdenum overlying the guard ring oxide have experienced failures due to peeling of the molybdenum and the generation of metal chips within the housing. These devices also have a reduced reverse energy handling capability due to poor contact to the guard ring. This has led to very poor yields in the manufacturing process and the yield for 100 volt devices has been as low as 2%.

Processes are known in which titanium or chromium layers are first applied atop the oxide which is atop the guard ring before a Schottky barrier metal is applied to the main exposed silicon surface of the device. After the oxide surface is coated with the chromium to titanium, a molybdenum or palladium layer is applied over the entire surface of the device, adhering well to both the underlying bare silicon and the titanium or chromium. A process of this type is disclosed, for example, in U.S. Pat. No. 3,642,528. This process is relatively complex and requires numerous masking steps and the process is of a nature which does not normally produce a good yield. Unavoidable back-plating of the titanium and chromium contaminates the desirable extremely clean silicon surface which receives the blocking layer.

BRIEF DESCRIPTION OF THE INVENTION

In accordance with the present invention, an etching step is employed after molybdenum or another main Schottky forming electrode is applied over the surface of a silicon substrate and over an outer oxide layer which passivates a guard ring. Thus, the outer periphery of the molybdenum layer is etched back, either to some point intermediate the oxide layer, thus exposing at least a portion of the oxide layer and, in other cases, completely away from the oxide layer, exposing a portion of the silicon substrate adjacent the inner periphery of the oxide ring. A titanium layer or a second metal which has good adherence to an oxide is then applied over the underlying Schottky forming metal and over the exposed portion of the oxide layer. Since the titanium or other metal will have good adherence to the oxide, it will prevent lift off of the molybdenum from the oxide and otherwise seals the molybdenum layer in place.

It has been found that the use of this etch back process for the underlying molybdenum or other Schottky forming layer and the subsequent deposition of a second metal which adheres well to the oxide has increased the yield of 100 volt Schottky devices from 2% to about 92%.

DETAILED DESCRIPTION OF THE INVENTION

Figure 1:
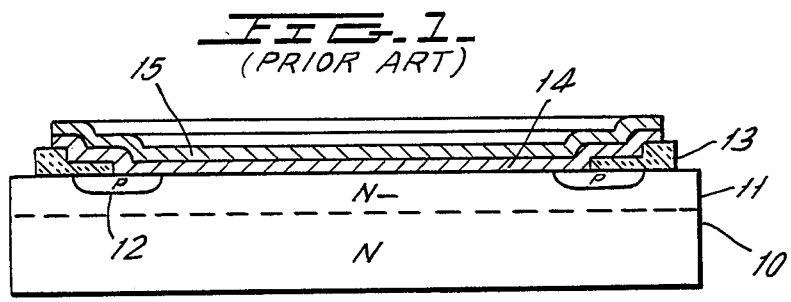
FIG. 1 is a cross-sectional view of a square Schottky diode chip made in accordance with prior art techniques.

Referring first to FIG. 1, there is shown therein a conventional Schottky diode, generally square in shape, which consists of a substrate 10 which may be of N-type conductivity monocrystalline silicon having an N-type layer 11 which may be epitaxially formed on the substrate 10. A P-type guard ring 12 is formed around the periphery of the upper surface of the epitaxial layer 11 and the outer periphery of the guard ring 12 is covered with a silicon dioxide layer 13. Note that the internal periphery of oxide ring 13 is located at approximately the center of the guard ring 12.

A layer of Schottky barrier forming metal such as molybdenum 14 then overlies the oxide 13. Note that the molybdenum 14, when extending over the oxide 13, will define a field plate of well known variety which is useful in increasing the blocking voltage of the device by shaping the depleted zone within the silicon 11 to increase its radius of curvature.

Metal layer 14 is then covered with a second layer 15 which conventionally is of titanium or an alloy thereof. Thereafter, the layer 15 is covered by solderable metals, such as a nickel layer and a subsequent silver layer, neither of which is shown. The titanium layer 15 serves as a barrier to the migration of nickel and silver atoms into the schottky barrier during the processing of the device and during the mount-down of the device onto a heat sink. The nickel layer serves to bond the titanium and silver layers together.

Prior art devices such as those of FIG. 1 are difficult to manufacture with good yield because the metals now in use, particularly molybdenum for layer 14, does not adhere well to the underlying oxide 13 and sometimes lifts off the oxide during subsequent processing steps of the device. Thus the effect of the field plate is lost and metal filaments are produced inside the device housing. MOreover, the molybdenum tends to lift away from the guard ring 12 and the ability of the device to withstand avalanche energy is substantially reduced. When losing the field plate effect, nominally 100 volt devices have been found to avalanche at 70 volts. When the field plate is present, avalanche occurs at 115 volts and higher. Moreover, a poor field plate is worse than no field plate since avalanche will occur first in the limited area where the plate lifted off of the oxide. A subsequent current "hogging" effect at the area will then cause catastrophic failure at low reverse energy levels. These effects occur even though the molybdenum layer 14 is very thoroughly baked during processing in an attempt to make the molybdenum adhere to the oxide.

Figure 2:
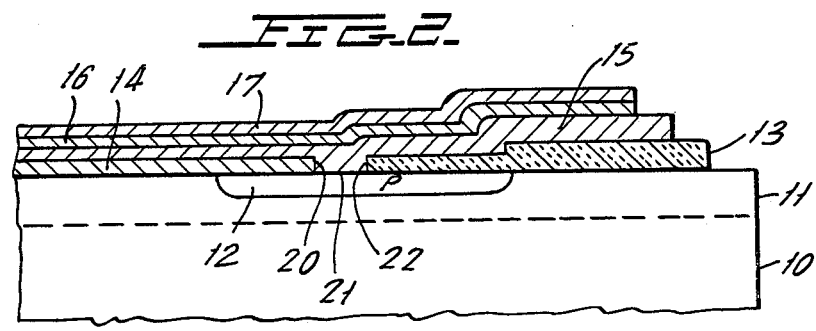
FIG. 2 is an enlarged view of a portion of a square chip, such as that shown in FIG. 1, which employs a first embodiment of the present invention.

A novel Schottky diode, made in accordance with the present invention, is shown in FIG. 2, wherein parts similar to those of the prior art of FIG. 1 have similar identifying numerals. In FIG. 2, a nickel layer 16 is placed atop titanium layer 15 and a silver layer 17 is placed atop the nickel layer 16. Dimensions have been greatly exaggerated in FIG. 2 for purposes of clarity.

In accordance with the invention, the underlying molybdenum layer 14 is etched back to terminate at the edge 20 which exposes a gap 21 beteen* the edge 20 of molybdenum layer 14 and the edge 22 of the inner periphery of oxide layer 13. The titanium metal 15 then overlies molybdenum metal layer 14 and contacts the silicon surface exposed by gap 21 and then overlies the oxide layer 13. Titanium is known to have good adherence to the oxide 13 so that the titanium layer 15 will strongly adhere to the oxide and will seal or glue the molybdenum layer 20 in place to prevent the previously experienced peeling of the molybdenum which overlies the oxide in the prior art arrangement of FIG. 1. Moreover, the titanium layer 15 is electrically continuous with the molybdenum layer 14 and overlies the oxide 13 to define the desired field plate which will remain intact through the subsequent processing steps in the manufacture of the device.

Figure 3:
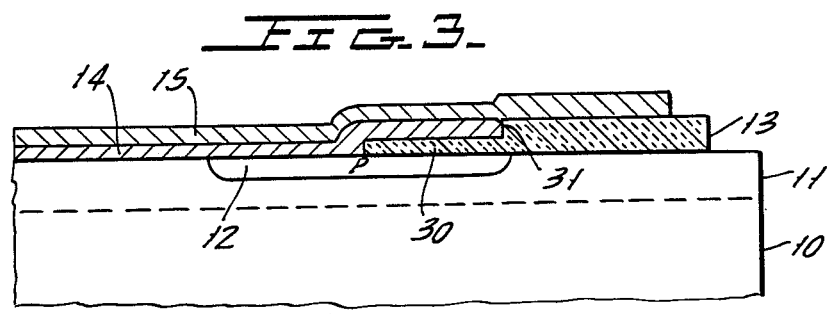
FIG. 3 is a cross-sectional view similar to that of FIG. 2 and shows a second embodiment of the present invention.

A second embodiment of the article of the invention is shown in FIG. 3 where elements similar to those of FIG. 2 have similar identifying numerals. The structure of FIG. 3 differs from that of FIG. 2 in that there is no gap 20, but the molybdenum layer 14 overlaps the oxide layer 13 at least for the width of the reduced thickness step 30 which is defined by the regrown oxide formed during the diffusion of the P-type ring 12. The titanium layer 15 then overlies the peripheral edge 31 of the molybdenum layer 14 and adheres to the exposed upper surface of the oxide 13 as in the case of FIG. 2, thereby securely sealing the periphery of the molybdenum layer 14 onto the oxide 13. Note that nickel and silver layers or other metals of a solderable nature are later added atop the titanium layer 15.

From the foregoing, it will be understood that the molybdenum layer 20 can be formed of any other metal which has desired Schottky barrier properties but which does not have good adherence to oxide. Moreover, the titanium layer 15 can be replaced by any other metal which has the properties of good adherence to the underlying oxide. For example, chromium or tantalum or other metals which adhere to oxides better than molybdenum could be used in place of the titanium. Moreover, it will be apparent that the oxide could be any other dielectric material and that the P-type and the conductivity type characteristics of the silicon could be reversed.

In practical application, due to misalignment tolerances, the molybdenum layer 14 may not overlap the oxide 30 around the entire periphery of the device and gaps, such as those of FIG. 2, may appear along the periphery or edge 22. This has not been found to affect device characteristics.

A typical process which can be used to manufacture the device of FIGS. 2 and 3, for the case of a 100 volt Schottky diode having about 75 amperes d-c average forward current is as follows:

The individual die size will be approximately 200 mils by 200 mils and will above a thickness of about 14 mils. The N type substrate 10 can be an arsenic doped substrate having a maximum surface resistivity of about 0.004 ohm cm. An epitaxially deposited film 11 is formed atop the substrate 10 and may be a phosphorus doped layer having a thickness from 9 to 11 microns and a surface resistivity in the range of 2.6 ohm cm. to 3.2 ohm cm.

The oxide layer 13 is then grown atop the upper surface of layer 11 to a thickness of about 9,000 Angstroms. An annular window having the general shape of the desired P-type diffused ring 12 is then etched into the oxide layer 13 using conventional photolithographic techniques. Boron is then diffused through the window to form the ring 12 to a depth of about 1.6 microns with from $1 \times 10^{19}$ to $1.5 \times 10^{19}$ boron atoms for the surface concentration. The outer periphery of the window formed within the chip can be about 180 mils by 180 mils.

Following the boron diffusion, a mask and etch step takes place to remove the regrown oxide from atop the interior surface area of the P-type region 12.

Thereafter, the exposed silicon surface is appropriately prepared as in the manner described in U.S. Pat. No. 4,206,540 in the name of Herbert J. Gould, entitled "SChottky DEvice and Method of Manufacture Using Palladium and Platinum Intermetallic Alloys and Titanium Barrier". During the process the molybdenum electrode 14 is deposited on the upper surface of the wafer and fully overlaps the full area of the oxide ring 13 with the molybdenum having a thickness of about 3,000 Angstroms.

In accordance with a significant feature of the invention, the molybdenum layer 14 is then masked and etched at its outer periphery so that the molybdenum layer is etched back either to the periphery 20 of FIG. 2 or the periphery 31 of FIG. 3. In the arrangement of FIG. 2, the gap 21 might be about 0.5 mils long, while in FIG. 3, the overlap of the molybdenum 14 over the oxide 20 might be about 1.5 mils. These dimensions are not critical. In the arrangement of FIG. 2, the titanium layer 15 touches the surface of the silicon 11 at the gap 21 without adversely affecting the device characteristics. The etching process for etching back the periphery of the molybdenum layer 14 may employ a dilute nitric acid etch, followed by a dilute hydrofluoric acid etch, followed by an etch with a dilute mixture of hydrochloric and nitric acid.

Following the etch-back of the periphery of the molybdenum layer 15, the titanium layer 15 is evaporated atop the full chip surface to a thickness of about 2,000 Angstroms. This is followed by the deposition of the nickel layer to a thickness of about 3 ½ microns. Since the titanium and nickel layers are relatively brittle, they are preferably relatively thin. The titanium, nickel and silver layers are then etched back from the outer periphery of the device in the usual fashion.

The chip is then appropriately mounted down on a heat sink or support and is placed in an appropriate housing.

Although the present invention has been described in connection with a number of preferred embodiments thereof, many variations and modifications will now become apparent to those skilled in the art. It is preferred, therefore, that the present invention be limited not by the specific disclosure herein, but only by the appended claims.

What is claimed is:

1. A semiconductor device having a monocrystalline silicon substrate of one conductivity type and having at least one planar surface;

a planar junction of the opposite conductivity type formed in said planar surface and separating said planar surface into a first surface portion of said one conductivity type and a second surface portion of said opposite conductivity type; said planar junction forming a guard ring; a thin layer of dielectric material on said planar surface and extending across and passivating at least one portion of said planar junction and exposing at least a portion of the area of said first surface portion; a first metal layer in contact with at least a portion of said area of said first portion and forming a Schottky barrier therewith; said guard ring surrounding said barrier; said first metal layer being of a material characterized in having a relatively good adherence to said first portion of said silicon substrate and relatively poor adherence to the surface of said layer of dielectric material; and a second continuous metal layer overlying and physically contacting at least an outer portion of the upper surface of said first metal layer including the lateral periphery of said first metal layer, and extending beyond at least the outer peripheral portion of said first metal layer and contacting at least a portion of the upper surface of said dielectric layer; said second metal layer being characterized in having good adherence to said first metal layer and to said dielectric layer and defining a stepped field plate extending from said first metal layer, and over the surface of said dielectric layer.

2. The device of claim 1, wherein said dielectric layer is an oxide layer, said first metal layer is molybdenum and said second metal layer is titanium.

3. The device of claim 2, wherein a layer of nickel overlies said titanium layer and a layer of silver overlies said layer of nickel.

4. The device of claim 1, wherein the outer periphery of said first metal layer is spaced by a gap from the periphery of the adjacent edge of said layer of dielectric material; said second metal layer engaging said silicon surface exposed by said gap.

5. The device of claim 4, wherein said dielectric layer is an oxide layer, said first metal layer is molybdenum and said second metal layer is titanium.

6. The device of claim 5, wherein a layer of nickel overlies said titanium layer and a layer of silver overlies said layer of nickel.

7. A Schottky diode comprising a thin chip of silicon having an N type body extending to a surface of said chip and a P type guard ring region formed in said surface and extending around the outer periphery of a portion of said surface; a dielectric layer extending across an outer peripheral portion of said guard ring region; a layer of a Schottky barrier forming metal formed on said N type surface and extending continuously onto at least said P type guard ring region; and a layer of a second metal overlying said Schottky barrier-forming metal layer and extending continuously across at least an outer portion of the upper surface of, and abuttingly overlapping, the lateral periphery of said Schottky barrier-forming metal layer, and further extending across and physically contacting at least a portion of the upper surface of said dielectric layer to form a field plate extending over said guard ring region; said Schottky barrier-forming layer being characterized in forming a desired Schottky barrier but having poor adherence characteristics to said dielectric layer; said second metal being characterized in having good adherence characteristics to said dielectric layer.

8. The device of claim 7, wherein said dielectric layer is an oxide layer, said Schottky barrier-forming metal layer is molybdenum and said second metal layer is titanium.

9. The device of claim 8, wherein a layer of nickel overlies said titanium layer and a layer of silver overlies said layer of nickel.

10. The device of claim 7, wherein the outer periphery of said Schottky barrier-forming metal layer is spaced by a gap from the periphery of the adjacent edge of said layr of dielectric material; said second metal layer engaging said silicon surface exposed by said gap.

11. The device of claim 10, wherein said dielectric layr is an oxide layer, said Schottky barrier-forming metal layer is molybdenum and said second metal layer is titanium.

12. The device of claim 11, wherein a layer of nickel overlies said titanium layer and a layer of silver overlies said layer of nickel.

13. The device of claim 1, wherein said Schottky barrier-forming metal layer overlies said layer of dielectric material.

14. The device of claim 8, wherein said Schottky barrier-forming metal layer overlies said layer of dielectric material.

* * * * *